United States Patent [19]
Tao et al.

[11] Patent Number: 5,104,684
[45] Date of Patent: Apr. 14, 1992

[54] ION BEAM INDUCED DEPOSITION OF METALS

[75] Inventors: Tao Tao, Somerville; John Melngailis, Newton, both of Mass.

[73] Assignee: Massachusetts Institute of Technology, Cambridge, Mass.

[21] Appl. No.: 528,861

[22] Filed: May 25, 1990

[51] Int. Cl.⁵ ............................................. B05D 3/06
[52] U.S. Cl. ..................................... 427/38; 156/643; 204/192.11; 204/192.34; 204/192.37; 427/43.1; 427/97; 427/125; 427/237; 427/253
[58] Field of Search ................ 427/38, 97, 309, 43.1, 427/124, 125, 237, 253; 204/192.11, 192.34, 192.35, 192.37, 192.25; 156/643

[56] References Cited

U.S. PATENT DOCUMENTS

| | | | |
|---|---|---|---|
| 4,748,045 | 5/1988 | Ehrlich et al. | 427/53.1 |
| 4,756,927 | 7/1988 | Black et al. | 427/53.1 |
| 4,868,005 | 9/1989 | Ehrlich et al. | 427/53.1 |
| 4,876,112 | 10/1989 | Kaito et al. | 427/38 |

FOREIGN PATENT DOCUMENTS 1257351 10/1989 Japan.
WO89/11553 11/1989 PCT Int'l Appl. .

OTHER PUBLICATIONS

"Focused Ion Beam Induced Deposition", John Melngailis and Patricia G. Blauner Mat. Res. Soc. Symp. Proc. vol. 147 (1989).

*Primary Examiner*—Bernard Pianalto
*Attorney, Agent, or Firm*—Thomas J. Engellenner; Michael I. Falkoff

[57] ABSTRACT

Metal is deposited in lines of submicron width by scanning a focused ion beam along a substrate in the presence a vapor of a precursor platinum compound. High deposition rates and steep walls may be obtained by milling a cavity or trench with the focused beam and then locally applying the precursor vapor while scanning of the beam continues. Platinum containing features deposited in this way extend horizontally between wires, or vertically between layers to form conductive interconnects in integrated circuits, and also form pattern repairs in x-ray masks. The platinum chemistry is compatible with silicon wafer processing.

16 Claims, 5 Drawing Sheets

ION BEAM INDUCED DEPOSITION OF METALS

The U.S. Government has rights in this invention pursuant to U.S. Army Contract DHAL03-87-K-0126 and U.S. Navy Contract N00030-84-C-0036.

BACKGROUND OF THE INVENTION

The present invention relates to induced CVD deposition of materials on masks and semiconductor chips, and particularly to ion beam induced deposition. A number of particular processes are known for depositing metal lines on a substrate by scanning a focused ion beam (FIB) along the locus of a desired growth line in the presence of a gas containing the metal to be deposited, so that the metal is selectively deposited in the regions scanned by the beam.

Unlike thermally induced or laser assisted CVD, the FIB induced deposition is a non-equilibrium process in which a great amount of energy is applied to a small area over a short time. Typically the deposited material contains a substantial quantity of impurities (over 25%) which include the ion beam species and various decomposition products of the metal precursor compound. Moreover, the deposition process competes with sputter-erosion of the material deposited by the ion beam. The rate of sputter-erosion thus places an upper limited on the ion beam energy effective to deposit metal. The metal precursor compound is generally fed locally to the region of the substrate, so that its vapor pressure does not impair the vacuum in the chamber along the ion beam path. The deposition process involves the formation of an adlayer of metal precursor on the substrate, which is broken down in situ to form the metal deposit. This adlayer, which may be a monomolecular or thicker layer, is reconstituted in between scans of the FIB, so that the adlayer formation rate poses a further constraint on the mechanics of deposition.

In addition to direct writing in this fashion, there are reports of using an FIB to form nucleation sites on the substrate, followed by thermally induced CVD to deposit a metal at the nucleated sites, as described in United States patent application Ser. No. 197,734 of Kubena et al, filed 23 May 1988. This pre-nucleation process reportedly operates at lower ion beam fluences than direct FIB induced CVD, and reportedly achieves greater purity of the deposited metal lines.

Among the metal precursor materials for FIB induced processes which have been reported are dimethyl gold hexafluoroacetylacetonate, iron pentacarbonyl, triisobutyl aluminum, and the hexacarbonyls of chromium, molbdenum and tungsten. Other precursors used to deposit impure but opaque lines for photomask repair include tungsten hexafluoride and tantalum pentaethoxide.

In general, these processes have deposited somewhat impure metal lines, of a resistivity substantially higher than the corresponding pure metals. Because of the relatively small path lengths involved, these deposits have nonetheless been suitable in some cases for forming conductive wiring in ICs. Further, the photon opacity of these deposits has made them suitable for photomask repair. However, the typical deposit thickness of 200–600 Angstroms and the porosity due to their organic impurities make these deposits relatively transparent to x-rays. There are prior suggestions of applying this technology to x-ray mask repair, by using as the ion beam a beam of gold or lead ions to provide a supplementary x-ray absorbing component in the deposition areas.

Overall, it may be said that while some FIB-induced CVD metal deposition processes have demonstrated feasibility if not commercial viability, the metal precursors and the deposition characteristics are by no means well understood or subject to predictable control. It is therefore desirable to determine other suitable precursors and detailed methods of pattern deposition and control.

SUMMARY OF THE INVENTION

In accordance with one aspect of the present invention, a focused ion beam induces deposition of platinum on an integrated circuit or mask. In accordance with another aspect of the invention, the same ion beam mills a cavity or via, into which the metal is deposited. Illustrative processes include custom chip fabrication by depositing specialized or one dimensional interconnects, microsurgery to correct subsurface chip defects, and repair of x-ray masks.

Articles fabricated, customized or repaired in accordance with methods of the invention include x-ray masks having buried pattern elements, chips with buried or inter-layer interconnects, and silicon devices with platinum interconnects.

A "mill and fill" method of FIB induced deposition of metal from a precursor proceeds at rates substantially higher than surface deposition techniques, and results in steep wall profiles especially beneficial and for microsurgical repairs of chips and x-ray masks.

BRIEF DESCRIPTION OF THE DRAWINGS

These and other features of the invention will be understood from the following figures, viewed in light of the prior art and the disclosure herein, wherein.

DETAILED DESCRIPTION

Figure 1:
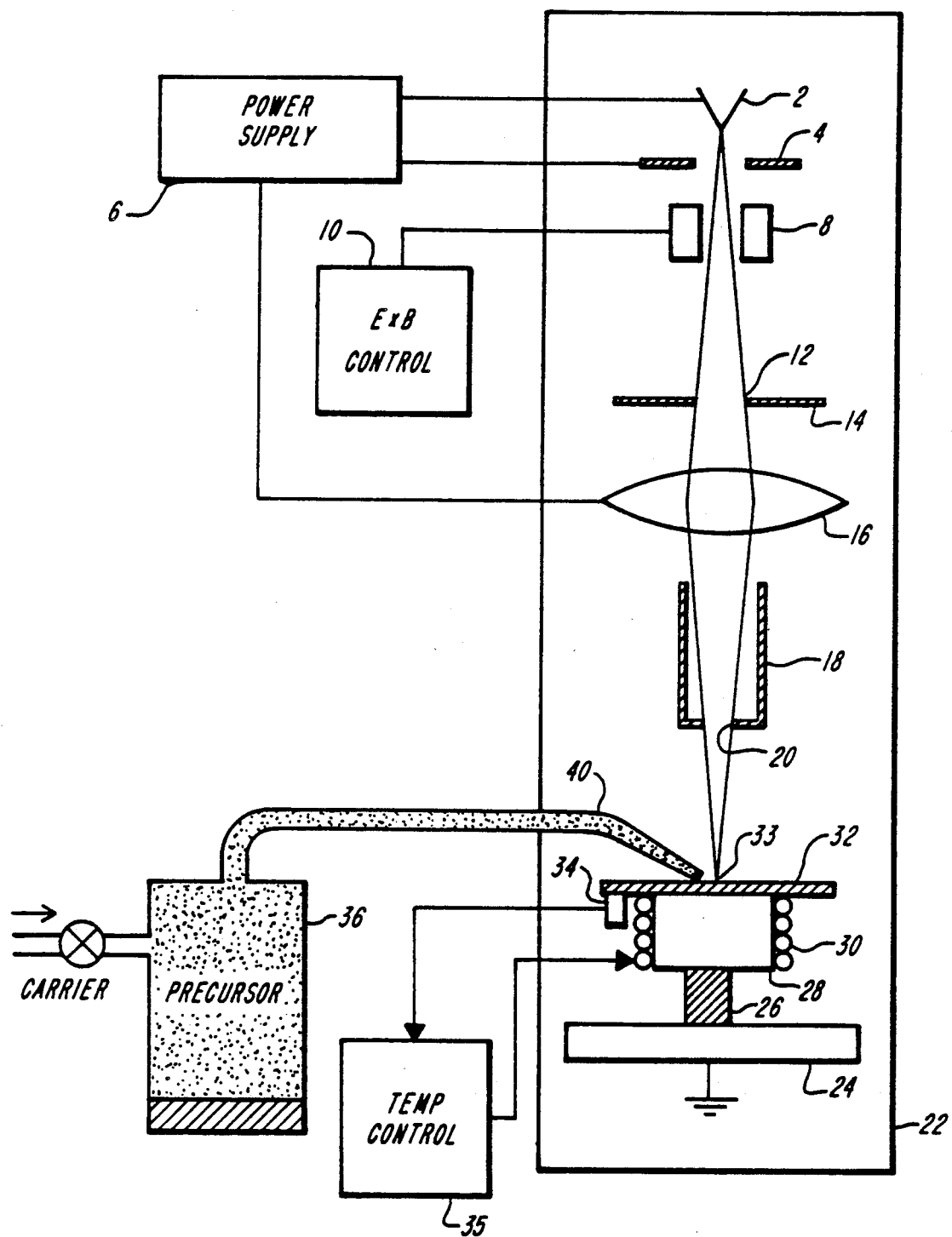
FIG. 1 shows a prior art system suitable for the practice of the invention.

For clarity of discussion, FIG. 1 illustrates a prior art system suitable for the practice of this invention, which includes a focused ion beam apparatus in a vacuum chamber 22 and directed at a substrate-holding stage 24. A reservoir 36 of metal precursor material is connected by a passage 40 to apply the material locally at the surface of a substrate 32 which is mounted on the stage 24, thus supplying an adequate concentration of the precursor material at the working surface without significantly impairing the vacuum level (hence the mean free path of ions) in the chamber 22.

The focusing ion beam includes a power supply 6 which applies different voltages between a liquid metal or bright ion source 2, an extraction electrode 4, and an accelerating lens assembly 16. An electric and magnetic field control unit 10 energizes the fields of a mass separator 8 which deflects unwanted isotopic species so that only a single species passes through a beam defining aperture 12 in a plate 14. When using a pure liquid metal ion source such as gallium, the mass separator is not required to produce a homogeneous beam.

The resultant beam is steered and scanned by a multipole deflector assembly 18 through blanking aperture 20 to a focused spot 33 on the substrate. While it is not particularly utilized in the practice of the present invention, the illustrated stage 24 includes a thermal stand-off 26 on which a heater 28 heated by coil 30 is mounted. A thermocouple 34 detects the temperature of the substrate and provides a closed loop feedback signal to a temperature control unit 35 to control the coil 30. A stage cooling mechanism may also be incorporated. By way of example, the focused ion beam assembly may be a commercial unit as those made by the British instrumentation manufacturer IBS, or may be a unit such as the Model 500D Focused Ion Beam milling system sold by F.E.I. Co., of Beaverton, Oreg.

Figure 2:
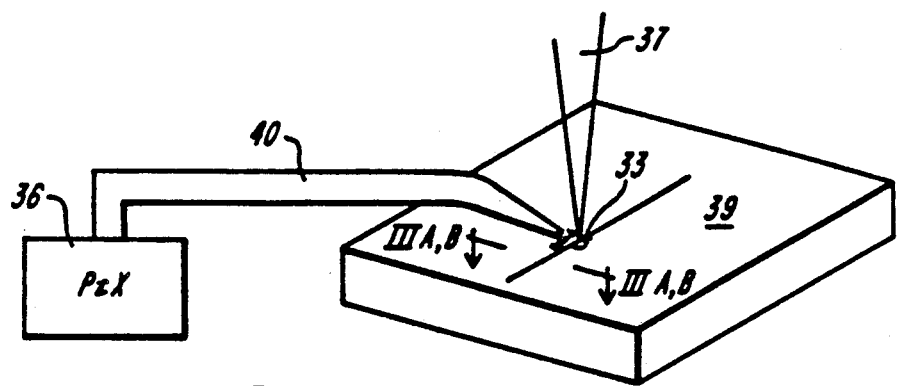
FIG. 2 schematically illustrates the practice of the invention.

FIG. 2 is a schematic perspective view of the practice of this invention. Focused ion beam 37 is scanned along a locus 39 on the surface of a substrate 32, forming a narrow focal spot 33 of 0.1–0.3 micron diameter at each point as it scans. Reservoir 36 and feed tube 40 feed a platinum-containing compound, denoted PtX, to the scanned region, where it is dissociated so that platinum together with moieties of the X, as well as ions from the beam, are deposited along the scan locus. A heater may be provided in the reservoir and feed tube to increase the vapor pressure outflow of PtX to the substrate.

Figure 3A:
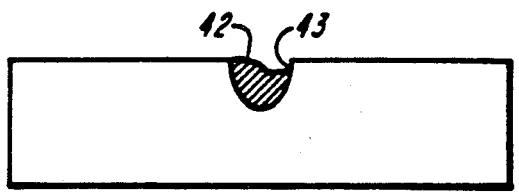
FIGS. 3A, 3B show different deposition geometries in accordance with the invention.
Figure 3B:
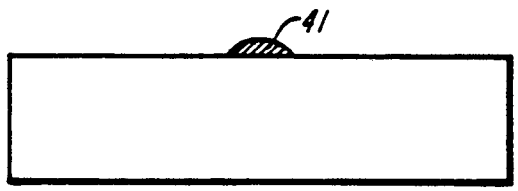
Figure 4A:
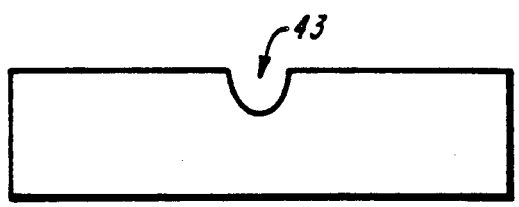
FIGS. 4A, 4B illustrate steps in attaining the geometry of FIG. 3A.
Figure 4B:
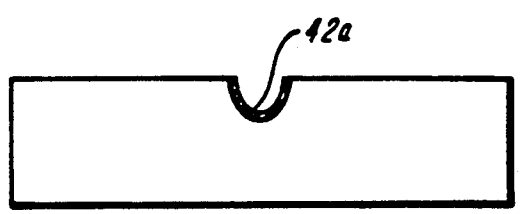
Figure 5A:
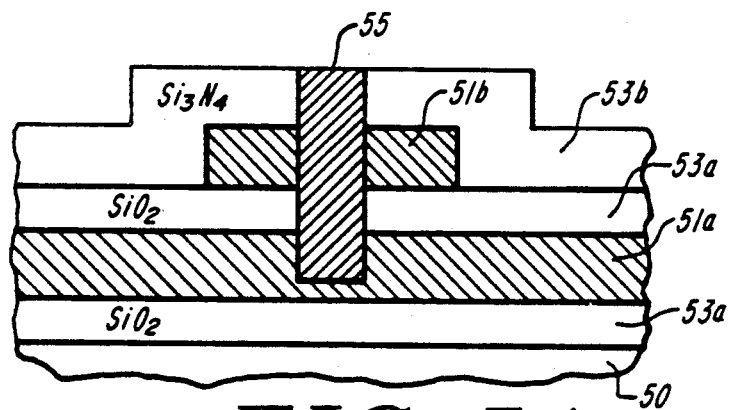
FIGS. 5A, 5B illustrate the invention applied to horizontal or vertical conductive interconnects.
Figure 5B:
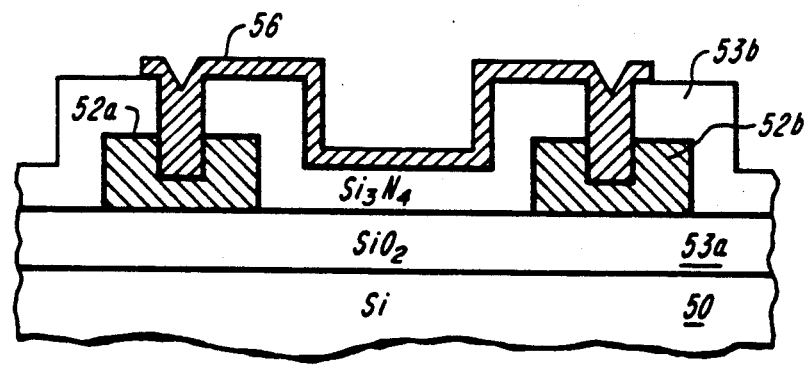

FIGS. 3A and 3B illustrate two different types of deposits 41, 42 which are formed in this manner according to different practices of the invention. Deposit 41 is formed as surface deposit along the beam scanning line on the upper surface of substrate 32. Deposit 42 is deposited as a subsurface deposit substantially filling a cavity 43 which extends below the upper surface of the substrate. More specifically, the subsurface or "filled" deposit 42 is formed by scanning the ion beam across a patterned area to form a cavity, pocket or trench 43, as illustrated in cross-section in FIG. 4A, and then applying the metal precursor vapor while ion beam scanning continues. This builds up a deposit 42a within the pocket or trench 43 (FIG. 4B), at a deposition rate which is considerably greater than the corresponding deposition rate for processes carried out with identical parameters on the surface. The enhance rate is believed to be due to internal sputtering and hence more complete breakdown of the precursor. As the deposition continues the hole is entirely filled as shown in FIG. 3A. As discussed more fully below, the feedstock, ion energy and other parameters are controlled so that deposition is optimized and the rate of deposition is greater then the rate of sputter removal of the deposited material FIG. 5A, 5B show further cross-sectional views of filled-cavity deposition processes applied to a substrate 32 which is a patterned silicon chip. In each of these embodiments a silicon chip 50 has one or more conductive layers or pattern elements 51a, 51b, 52a, 52b separated by passivating or insulating layers 53a, 53b. The conductive layers or elements are interconnected first by ion beam milling a pathway therebetween, and then filling the path so milled to form a conductive interconnection. The filled path may be a multi-level interconnect 55 as in FIG. 5A, a horizontally-extending interconnect 56 between two buried conductors as in FIG. 5B, or some combination of these.

The process of metal deposition into a milled cavity in this manner provides exceptionally steep side walls, and is well suited to performing microsurgery for chip repair or interconnect customization in densely patterned chips. Such steep walls are also useful for x-ray mask repair. Further, when used to form shadow pattern elements in an x-ray mask, the subsurface platinum features are substantially immune to erosion and to other forms of pattern damage.

Figure 6:
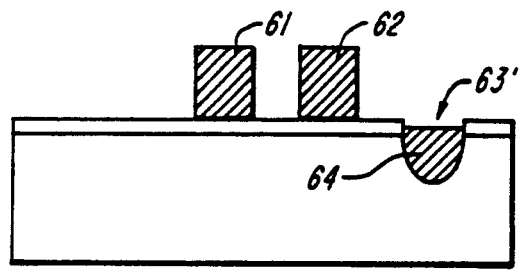
FIG. 6 illustrates the invention as applied to repair of x-ray masks.

Such mask repair is illustrated in FIG. 6, wherein the mask 60 has pattern elements 61, 62 formed of an x-ray absorbing material and which are generally quite thick, extending 1–2 microns above the surface. An eroded pattern element at location 63' is removed by FIB milling, and a corresponding element 64 is deposited as a filling in the removal cavity in the manner described above. This results in an x-ray mask having both surface deposited and subsurface filled-in shadowing pattern elements.

A presently preferred metal precursor compound used for the deposition of platinum is the organometallic compound methylcyclopentadienyl trimethyl platinum. This material is solid at room temperature, and also stable in air, with a sufficiently high vapor pressure (approximately 0.054 Torr.) that the reservoir 36 and feed tube 40 may be operated without heaters or a flow of carrier gas.

This compound was synthesized from trimethyl platinum iodide and sodium methylcyclopentadienide using the method described by Fritz and Schwarzhans. It was found to have a vapor pressure of 0.054 torr at 23° C. and 0.40 torr at 50° C., melted at 29.5–30° C. and was subject to gradual decomposition at temperatures above 50° C.

Using this material, platinum films were deposited on substrates of Si, $SiO_2$ and Al, and the resultant film thickness, composition, structure and electrical properties were measured under varying deposition conditions.

In one procedure a platinum line was laid down by scanning a focused 35KeV gallium ion beam with a current of 20 pA over a 22 micron path length in the presence of the platinum precurso vapor. This produced a deposit of 0.3 micron width, a dimension identical to the width of a trench milled by scanning the ion beam alone in the absence of the precursor. Together with the presence of small scale ripples corresponding to scan beam oscillations, this established that the ion beam diameter was the determining factor in linewidth dimension. In other prototype procedures, platinum lines 350×0.3 microns were deposited, cavities four microns square were formed by ion beam milling in a multilayer substrate, and regions of platinum were deposited over a ten by thirty micron area by suitable scanning of the ion beam. The ion beam was found to focus to a smaller area than a laser, and to cut cleaner holes. Most of the scanning was done with a line scan frequency of 9 KHz and a vertical scan of 200 Hz, corresponding to 100 frames per second.

Figure 7:
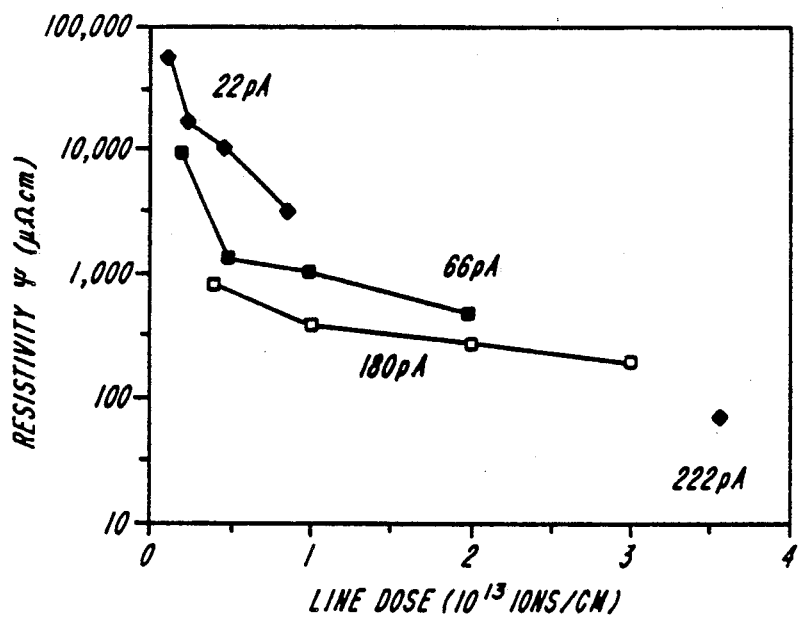
FIG. 7 is a graph of resistivity of deposited platinum as a function of ion beam current.

FIG. 7 shows the resistivity of platinum films deposited at various beam currents. At a constant beam current, the film resistivity decreases as the total ion line dose increases, corresponding to an increase in film thickness. At low line doses the films are thin and discontinuous, with a higher resistivity. With a constant line dose, the resistivity drops as ion beam current increases, with the lowest value, 70 micro ohm cm., observed at the highest ion beam current 222 pA.

Figure 8:
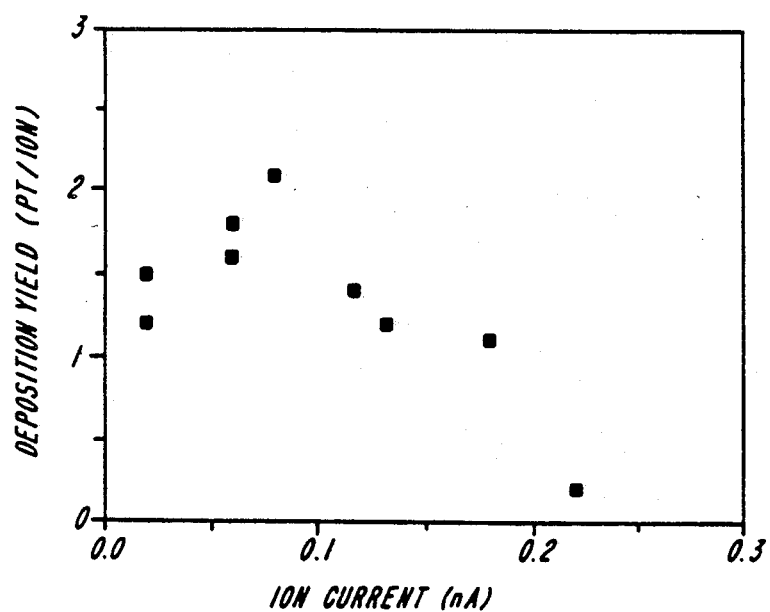
FIG. 8 is a graph of deposit yield as a function of ion beam current.

FIG. 8 plots the platinum film deposition yield per ion, assuming the deposit is entirely platinum, as a function of ion beam current. The yield is relatively constant up to a threshhold beam current of 0.2 pA, above which the beam density is so large that the adsorbed platinum precursor is depleted and sputtering begins to predominate.

Figure 9:
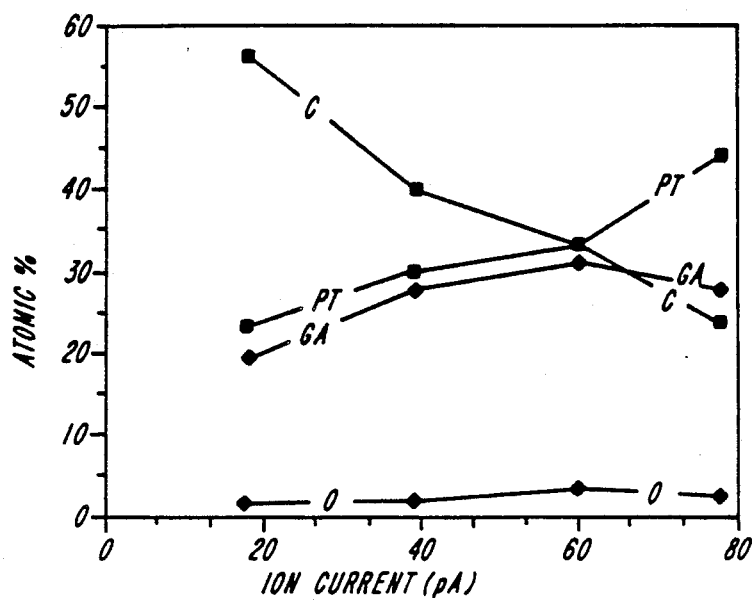
FIG. 9 is a graph of deposit composition as a function of ion beam current.

FIG. 9 shows the composition, as a function of ion beam current, of platinum films deposited as 8×8 micron squares on silicon oxide.

Above a beam current of 80pA, sputtering predominated over deposition. Large percentages of carbon were observed on the surface, so the compositional measurements were made after sputtering away several layers of surface atoms. In general, increasing the beam current had the affect of rapidly lowering the amount of carbon, and rapidly increasing the amount of platinum in the deposits. Platinum concentrations as great as 46% were achieved.

In some of these experiments, hydrogen was also added by a second jet proximate to the substrate to determine its effect on carbon deposits. It was found that unlike the case with heated CVD processes and with certain laser induced CVD processes that operate at thermal equilibrium, the addition of hydrogen was not effective to clean up organic residues, and did not significantly alter the resistivity of the deposited film.

Figure 10:
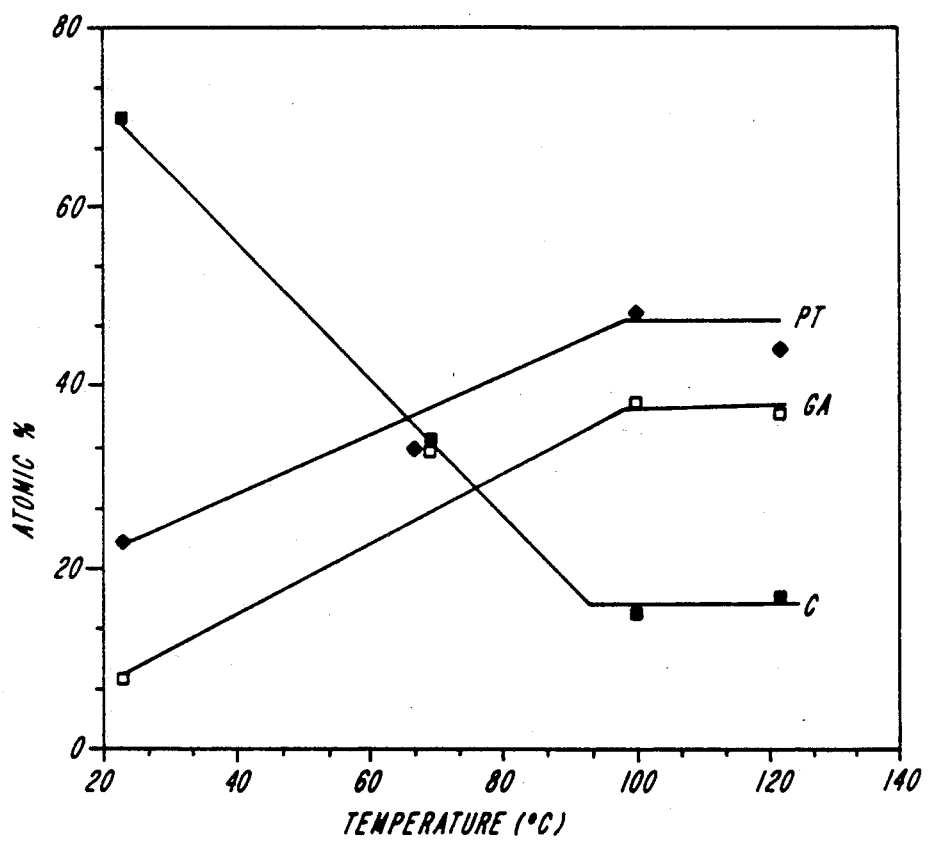
FIG. 10 is a graph of deposit composition as a function of substrate temperature.

The purity of the film improved when the temperature of the substrate was raised (FIG. 10), but the deposition yield was greatly decreased so that no resistivity or thickness measurements could be conducted. This effect may have resulted from poor adsorption of the platinum precursor onto the substrate at elevated temperatures.

As noted above, the precursor was a solid at room temperature, with a relatively high vapor pressure of 0.054 torr. Preferably the precursor material has a vapor pressure above 0.01 Torr.

By providing a heater in the reservoir and feed tube, the flow of precursor material to the substrate is enhanced. This feature may be especially useful for efficiently depositing conductive lines or other patterns in which replacement of the adlayer must occur between closely spaced scans of the beam.

In general, the range of useful ion beam currents is considered to lie between one milliamp/cm$^2$ and ten microamps/cm$^2$. Different ion beam energies were employed between 10 KeV and 100 KeV, primarily in the 35-50 KeV range. In general, focused ion beams of an energy between 100 eV and 250,000 eV are considered suitable for the practice of the invention, although for lower energies, in order to deposit fine patterns, a suitable means for focusing the low energy ion beams may have to be developed.

The formation of conductive platinum pattern elements in this fashion is fully compatible with silicon chip technology, and may be utilized for the customization of chips by providing a chip which contains an array of standard cells, and utilizing the through-deposition processes of FIGS. 5A, 5B to form conductive interconnections.

The invention further contemplates the deposition of platinum layers or patterns using a non-focused broad beam ion source. With a broad beam source, a projection mask may be used to define particular pattern elements.

Most of the experiments were carried out with a gallium ion beam, which, together with the platinum deposit, gave a suitable density for x-ray mask repair, and also provided suitable resistivities for circuit interconnects. Other suitable ions for various applications are considered to be the noble gases He, Ar, Ne, Xe, and Kr as well as Si, Au, B, Bi, P, H and H$_2$ positive ions.

Among the precursor metal compounds, those listed in Table 1 are considered suitable. These include organic and inorganic platinum compounds. For some applications it is preferable that the non platinum decomposition products of the precursor be gaseous, or include light weight moieties that can be removed.

TABLE I

Pt(acetylacetonate)$_2$
Pt(CO)$_2$Cl$_2$
Pt(PF$_3$)$_4$
CpPt(CH$_3$)$_3$ (where Cp is $\eta^5$-C$_5$H$_5$)

This completes a description of the invention, which has been described with reference to one presently preferred platinum precursor compound and several illustrative products. The invention being thus disclosed, various modifications and adaptations of processes and articles of manufacture will occur to those skilled in the art, and all such modifications and adaptations are considered to be within the scope of the invention and its range of equivalents.

What is claimed is:

1. A method of forming a conductive deposit on a substrate, such method comprising the steps of
   i) directing an ion beam at a locus on the substrate
   ii) providing a platinum containing vapor precursor at the locus while the ion beam is incident on the locus to selectively deposit metallic platinum thereon.

2. The method of claim 1, wherein step i) is performed before step ii) to mill an opening through the surface of the substrate and step ii) deposits the conductive deposit in the opening.

3. The method of claim 2, wherein the opening has a high aspect ratio resulting in internal sputtering such that platinum deposition proceeds at an enhanced rate in the opening.

4. The method of claim 2, wherein the substrate is an X-ray lithography mask.

5. The method of claim 1, wherein the ion beam is a focused ion beam.

6. The method of claim 5, wherein said focused ion beam focuses to a spot under one micron diameter.

7. The method of claim 1, wherein the platinum containing vapor precursor is an organometallic compound.

8. The method of claim 7, wherein the organometallic compound is a polymethyl platinum conjugated ring compound.

9. The method of claim 7, wherein the organometallic compound is a solid and has a vapor pressure greater than 0.01 torr at room temperature.

10. The method of claim 1, wherein the platinum containing vapor precursor is an inorganic compound.

11. The method of claim 1, wherein the platinum containing precursor is a compound selected from the group consisting essentially of Pt(acetylacetonate)$_2$; Pt(PF$_3$)$_4$; Pt(CO)$_2$Cl$_2$; and methylcyclopentadienylplatinum trimethyl.

12. The method of claim 1, wherein ions of the focused ion beam include positive ions of one of Ga, He, Ar, Ne, Xe, Kr, Si, Au, B, Bi, P, H˙ and H$_2$.

13. The method of claim 1, wherein said ion beam has an ion energy between 100 electron volts and 300,000 electron volts.

14. The method of claim 13, wherein said ion beam is a focused ion beam with an ion energy below approximately 100,000 electron volts.

15. A method of depositing a metal on a substrate, such method comprising the steps of focusing an ion beam on the substrate to mill a cavity in the substrate, and applying a metal compound vapor to said cavity in the presence of said ion beam such that deposition of the metal proceeds at an enhanced rate within the cavity.

16. A method of forming a custom chip, such method comprising the steps of
providing a chip containing an array of standard cells, and
interconnecting selected ones of the standard cells with platinum-containing conductive lines said-step of interconnecting including the steps of providing a platinum containing precursor in a region of the chip and directing an ion beam along a path extending between the selected ones of the standard cells to deposit the platinum-containing lines.

* * * * *